(12) United States Patent
Freitag et al.

(10) Patent No.: US 10,832,901 B2
(45) Date of Patent: Nov. 10, 2020

(54) EELS DETECTION TECHNIQUE IN AN ELECTRON MICROSCOPE

(71) Applicant: FEI Company, Hillsboro, OR (US)

(72) Inventors: Bert Henning Freitag, Eindhoven (NL); Sorin Lazar, Eindhoven (NL); Stephan Kujawa, Eindhoven (NL); Maarten Kuijper, Eindhoven (NL); Gerard Nicolaas Anne van Veen, Eindhoven (NL); Peter Christiaan Tiemeijer, Eindhoven (NL); Jamie McCormack, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/424,206

(22) Filed: May 28, 2019

(65) Prior Publication Data
US 2019/0341243 A1   Nov. 7, 2019

(30) Foreign Application Priority Data

May 2, 2018  (EP) .................................... 18170373

(51) Int. Cl.
*H01J 49/44*  (2006.01)
*H01J 49/00*  (2006.01)
(Continued)

(52) U.S. Cl.
CPC .......... *H01J 49/44* (2013.01); *H01J 49/0004* (2013.01); *H01J 49/0027* (2013.01); *H01J 49/025* (2013.01); *H01J 49/08* (2013.01)

(58) Field of Classification Search
CPC .. H01J 49/44; H01J 37/00; H01J 37/02; H01J 37/05; H01J 37/244; H01J 37/32972

(Continued)

(56) References Cited

U.S. PATENT DOCUMENTS

| | | | |
|---|---|---|---|
| 7,642,513 | B2 | 1/2010 | Pinna et al. |
| 2005/0030373 | A1* | 2/2005 | Chao ................. H01J 37/222 348/79 |

(Continued)

OTHER PUBLICATIONS

CCD and CMOS Sensor Architecture and Readout Modes, Rolling Shutter vs Global Shutter, Aug. 1, 2014, XP055261571, QImaging. com, retrieved from the Internet.

*Primary Examiner* — Jason L McCormack (57) ABSTRACT

A method of performing Electron Energy-Loss Spectroscopy (EELS) in an electron microscope, comprising:
Producing a beam of electrons from a source;
Using an illuminator to direct said beam so as to irradiate the specimen;
Using an imaging system to receive a flux of electrons transmitted through the specimen and direct it onto a spectroscopic apparatus comprising:
A dispersion device, for dispersing said flux in a dispersion direction so as to form an EELS spectrum; and
A detector, comprising a detection surface that is subdivided into a plurality of detection zones,
specifically comprising:
Using at least a first detection zone, a second detection zone and a third detection zone to register a plurality of EELS spectral entities; and
Reading out said first and said second detection zones whilst said third detection zone is registering one of said plurality of EELS spectral entities.

15 Claims, 4 Drawing Sheets

(51) Int. Cl.
*H01J 49/02* (2006.01)
*H01J 49/08* (2006.01)

(58) Field of Classification Search
USPC .......................................................... 250/305
See application file for complete search history.

(56) References Cited

U.S. PATENT DOCUMENTS

| | | |
|---|---|---|
| 2011/0155906 A1 | 6/2011 | Terada |
| 2014/0185781 A1* | 7/2014 | Reitz ....................... G01T 7/005 |
| | | 378/207 |
| 2016/0276130 A1* | 9/2016 | Mele ........................ H04N 5/32 |
| 2017/0125210 A1 | 5/2017 | Henstra et al. |
| 2017/0322322 A1* | 11/2017 | Gubbens ............... G01T 1/2018 |

* cited by examiner

EELS DETECTION TECHNIQUE IN AN ELECTRON MICROSCOPE

The invention relates to a method of performing Electron Energy-Loss Spectroscopy (EELS) in an electron microscope, comprising:
- A specimen holder, for holding a specimen;
- A source, for producing a beam of electrons;
- An illuminator, for directing said beam so as to irradiate the specimen;
- An imaging system, for receiving a flux of electrons transmitted through the specimen and directing it onto a spectroscopic apparatus comprising:
  - A dispersion device, for dispersing said flux in a dispersion direction so as to form an EELS spectrum;
  - A detector, comprising a detection surface that is subdivided into a plurality of detection zones.

The invention also relates to an electron microscope in which such a method can be enacted.

Electron microscopy is a well-known and increasingly important technique for imaging microscopic objects. Historically, the basic genus of Electron Microscope (EM) has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.
- An SEM can also be used in "transmission mode", e.g. when using relatively thin samples and a relatively high incident beam energy. Such a tool is often called a "TSEM" (Transmission SEM), and it will typically have a relatively rudimentary imaging system (e.g., a single lens and deflector) disposed between the specimen and post-specimen detector, which detector may comprise an EELS module.

It should be noted that, in addition to imaging, performing (localized) surface modification (e.g., milling, etching, deposition, etc.), and conducting spectroscopy, an electron microscope may also have other functionalities, such as examining diffractograms, studying ion channeling/ion backscattering (Rutherford Backscattering Spectrometry), etc.

In all cases, a transmission-type EM (S(TEM) or TSEM) will comprise at least the following components:
- An electron source, such as a Cold Field Emission Gun (CFEG), Schottky electron source ("hot FEG"), thermionic source, etc.
- An illuminator (illuminating electron beam column), which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated. If desired, the illuminator may comprise a monochromator, which serves to narrow an energy spread of electrons sent toward the specimen; such a monochromator typically comprises a dispersion device (such as a Wien filter, for example) that is exploited to allow exclusive selection of electrons within a selected energy range—e.g. so as to improve attainable resolution in an EELS measurement and/or to curtail adverse effects of chromatic aberration on image quality.
- A specimen holder—generally connected to a positioning system—on which a specimen under investigation can be held and positioned (e.g. displaced, tilted, rotated). If desired, this holder can be moved so as to effect scanning motion of the specimen with respect to the beam. When intended to hold cryogenic specimens, the specimen holder can be provided with a suitable cooling device.
- An imaging system (imaging electron beam column), which essentially takes electrons that are transmitted through a specimen (plane) and directs (focuses) them onto a sensing device. As with the illuminator referred to above, the imaging system may also perform other functions, such as aberration mitigation, cropping, filtering, etc., and it will generally comprise one or more charged-particle lenses and/or other types of particle-optical components.
- A sensing device (detector), which may be unitary or compound/distributed in nature, and can take many different forms, depending on what it is intended to sense. It may, for example, comprise one or more photodiodes, CMOS detectors, CCD detectors, photovoltaic cells, etc. The sensing device may be comprised in a sub-component such as an EELS module.

When such an EELS module is present, it will generally comprise:
- A dispersion device (e.g. comprising one or more "electron prisms"), to disperse—along a dispersion direction—an incoming flux of electrons (from the imaging system) into an energy-resolved (continuous) array of spectral sub-beams, which can ultimately be directed onto a detection surface so as to form a spectrum. Basically, said incoming flux will contain electrons of various energies, and the dispersion device will "fan these out" along said dispersion direction into a spectrum (in a manner somewhat reminiscent of a mass spectrometer).

EELS is a technique used in EMs to obtain elemental/chemical information pertaining to a given specimen. A moving electron in an irradiating beam (from the EM's illuminator) can transfer energy to a bound electron in a core shell of an atom in the specimen, and promote this core electron to an outer shell (inelastic scattering). This energy transfer from the moving electron gives rise to a so-called "Core Loss Peak" (CLP) in the EELS spectrum. The (coarse) position (in energy units) of the CLP is element-specific, and its precise position and shape are specific to the element's chemical environment and bonding. In addition to the CLPs referred to above, an EELS spectrum will generally also comprise:

A so-called Zero Loss Peak (ZLP), which essentially corresponds to electrons from the irradiating beam that have traversed the specimen without (substantial) energy loss.

Intermediate features (IFs)—between the ZLP and CLPs—such as so-called "Plasmon Resonance Peaks" (PRPs), which are a relatively broad series of peaks/shoulders associated with single or multiple scattering of electrons on plasmons in the specimen. These PRPs typically lie in the energy range 0-50 eV. Other examples of intermediate features include phonon resonances and band gap features (intensity discontinuities), for example.

EELS modules can also be used as energy-selective imaging devices (EFTEMs: Energy-Filtered TEMs). To achieve this, they employ a slit ("letterbox") at/proximal their (primary) spectrum plane. When the module is used as a pure spectrometer, this slit is retracted, and the spectrum plane can be magnified and imaged onto the employed detector (camera) using post-dispersion optics. On the other hand, when the module is used as an energy-selective imaging device, the slit can be invoked to pass/admit only a specific energy window (typically of the order of 10-50 eV wide); in that case, the post-dispersion (post-slit) optics then image a Fourier Transform plane of said spectrum plane onto the detector.

EELS detection presents various substantial challenges. Because of possible instabilities/fluctuations in the (high-tension) electrical power supplied to the illuminator, imaging system, source and/or EELS module, a precise measurement of the position of a CLP or IF typically requires concurrent or near-concurrent recording of the ZLP. This is conventionally referred to as "tracking the ZLP", which inter alia acts as a metric for noise levels and an absolute energy scale reference for the CLP/IF. Simultaneous recording of the ZLP and the CLP/IF is typically not straightforward, inter alia because of the generally large intensity difference between the ZLP and the CLP/IF (which can easily be of the order of 1000) and the generally large (energy) separation between the ZLP and the CLP/IF (which can be well above 2000 eV (electron volts), where 0.2 eV resolution is required/desired). Presently, near-simultaneous recording can be achieved using a so-called "Dual EELS" technique, e.g. as set forth in U.S. Pat. No. 7,642,513. In Dual EELS, two exposures are made in a single acquisition on the employed detector (e.g. a pixelated CCD camera), where one relatively short exposure (~1 µs, thus requiring an ultra-fast beam blanker/exposure shutter) is to record the ZLP, and a longer exposure (~10 ms) is to record the CLP/IF. However, the Dual EELS technique (just as with extensions thereof, such as "Triple EELS"/"Multiple EELS") only allows near-simultaneous rather than truly simultaneous recording of different EELS spectral components and, in principle, fluctuations can still occur between component exposures, thereby causing an intrinsic uncertainty/error margin in results.

Another issue with EELS detection is that conventional imaging devices, such as CCD and CMOS devices, exhibit so-called "dead times" during which the detector is blanked for information readout. During such dead times, the specimen will still be illuminated by the impinging electron beam, as a result of which:

The (sensitive) specimen suffers unnecessary radiation damage;

Potential signal is wasted, causing a reduction in Signal-to-Noise Ratio (SNR).

One could potentially endeavor to perform readout without detector blanking, but that would result in "blurring" (mixing) of the spectral responses from neighboring positions on the specimen.

It is an object of the invention to provide an alternative EELS detection strategy

BRIEF DESCRIPTION OF THE DRAWINGS

The invention will now be elucidated in more detail on the basis of exemplary embodiments and the accompanying schematic drawings, in which.

In the Figures, where pertinent, corresponding parts are indicated using corresponding reference symbols.

DESCRIPTION

In particular, it is an object of the invention that this alternative detection strategy should make efficient use of available measurement flux and time.

These and other objects are achieved in a method as set forth in the opening paragraph above, characterized by:

Using at least a first detection zone, a second detection zone and a third detection zone to consecutively register a plurality of EELS spectral entities;

Reading out said first and said second detection zones whilst said third detection zone is registering one of said plurality of EELS spectral entities.

By using at least three detection zones for consecutively registering a plurality of EELS spectral entities, it is possible to continuously register one of a plurality of EELS spectral entities, whilst allowing time for the other two detection zones to be read out. In particular it is possible to cycle registration of one (or more) of a plurality of EELS spectral entities between the at least three detection zones. During registration with one of the at least three detection zones, at least two other detection zones of the at least three detection zones can be read out. Read out of the two other detection zones can be simultaneous, i.e. reading out the first detection zone and the second detection zone at the same time; or subsequently, i.e. reading out the first detection zone first, and only after that reading out the second detection zone.

Hence, it is possible to use the first detection zone to register a first EELS spectral entity, and to simultaneously read out the second detection zone and (concurrent or subsequently) read out the third detection zone. After exposure of the first detection zone, it is possible to expose the second detection zone to register a second EELS spectral entity, and to read out the first detection zone (and continue to read out the third detection zone). After exposure of the second detection zone it is possible to use the third detection zone to register said first EELS spectral entity again, and to continue reading out the first detection zone and to read out the second detection zone. This way, three detectors can be used to register a first and a second EELS spectral entity.

Thus, exposure of the at least three detection zones is cycled for consecutively registering a plurality of EELS spectral entities, and exposure of one of the three detection zones coincides with dead time and/or read out of the other two detection zones.

The invention provides a more efficient registration/readout duty cycle when recording an EELS spectrum. It achieves this by ensuring that, when parts of the detector are "blind" to an incoming electron flux (during readout), another part of the detector is still "live" and registering electrons. This can be advantageous for a number of reasons, such as the following:

The invention reduces the "dead time" present in conventional detection approaches, opening the way for shorter (cumulative) measurement times on a given specimen, with a concurrent reduction in the specimen's cumulative radiation exposure/dose, and attendant reduction in radiation damage to (sensitive) specimens.

The invention provides a longer readout time for each exposed detection zone, allowing a greater quantity of charge to be drawn from each exposed pixel, and thus reducing readout noise. This is because one has the luxury of being able to continue to read out an exposed zone while other zones in the detector are undergoing exposure.

Somewhat analogous to the previous point, in situations in which a scintillator is used upstream of the detector—which is often the case—there is now (much) more time for an excited area of the scintillator to "glow out" before the detection zone under that area is invoked for a subsequent measurement. In other words, "afterglow" from the scintillator area in question can harmlessly die off for an extended period, thus helping to prevent a "ghost" exposure (from the afterglow) when the underlying detection zone is once again invoked for a registration cycle.

The invention is versatile as regards the roles assigned to the abovementioned plurality of EELS spectral entities. Said plurality of EELS spectral entities may comprise first and second EELS spectral entities. For example:
(a) In one scenario, said first and second spectral entities comprise different regions of a single EELS spectrum, taken at a single position on the specimen.
(b) In an alternative scenario, the first and second spectral entities comprise corresponding regions from two EELS spectra, respectively taken at two different positions on the specimen.
(c) At a given specimen position, the same EELS spectrum (or a given region thereof) could be recorded on a plurality of (or all of) the detection zones of the detector.

In somewhat more detail:
In situation (a), one of the first and second spectral entities could comprise an IF and the other could comprise a CLP, for example. Alternative, they could both comprise different CLPs or CLP groups, for example. In principle, (at least) one of them could also comprise a ZLP; in such a scenario, since the time required to register a (relatively bright) ZLP would be much shorter than that required to register a (relatively faint) CLP/IF, one could shorten the registration time allotted to the detection zone used to record the ZLP. Using the detector in this matter effectively corresponds to a form of "Multiple EELS" as referred to above.

In situation (b), the first and second spectral entities could each comprise a given CLP (group), for example. Alternatively, they could each comprise a ZLP—for instance, in a scenario in which the ZLP is being "tracked" so as to reveal underlying temporal fluctuations in the output of the microscope's high-tension power supply (used inter alia for its accelerator electrodes). Moreover, they could each comprise an (essentially) entire EELS spectrum, if so desired.

In situation (c), one could, for example, combine/sum the output from the various detection zones, so as to improve SNR. Alternatively, registered detection results from two different detection zones could be mutually subtracted so as to perform "differential spectroscopy", e.g., to track changes to an EELS spectrum as a function of time.

Alternative/hybrid scenarios are, of course, also possible: for example, a given detection zone could be used to record a first spectral entity at a first specimen position and a second, different spectral entity at a second, different specimen position. As already mentioned above, it is possible to adjust the registration time of a given detection zone on a per-case basis, which allows great flexibility as regards the roles assigned to the different detection zones. Such adjustment can, if desired, be automated, e.g. as in the case of software used to acquire a batch of spectra on a specimen according to a pre-determined "recipe", whereby it can be known in advance what roles will be assigned to the various detection zones.

With regard to the situation (a)/"Multiple EELS" possibility discussed in the previous paragraph, it can be useful to consistently allocate a given detection zone to a given spectral region in the course of a given measurement session (encompassing measurements at a plurality of specimen positions)—for example, it can be advantageous to consistently register a relatively bright spectral portion (e.g. ZLP) using a selected detection zone $Z_i$ and to register a relatively dim spectral portion (e.g. CLP) using a different detection zone $Z_j$. In an embodiment, the first detector zone is used for measuring the bright spectral portion, and the second and third detector zone are used to measure the relatively dim spectral portion. This can help to prevent spectral "pollution" by mitigating "crosstalk" between spectra, e.g. associated with afterglow in a scintillator, hysteresis in the detector electronics, etc.

In an embodiment of the invention, a magnification of the EELS spectrum on the employed detector is adjustable. This aspect is inter alia relevant in the context of situation (a) above, since it offers a scaling functionality that can be used to determine whether a given detection zone is used to record an entire EELS spectrum or just a (zoomed-in) region thereof. Such selectable magnification can, for example, be achieved by using an adjustable lens element between the dispersion device and detector.

In another embodiment of the invention, a first deflection device can be used to fine-tune a position of the EELS spectrum parallel to the dispersion direction. Inter alia in combination with the scaling functionality described in the previous paragraph, such deflection allows (a particular region of) an EELS spectrum to be accurately positioned on a given detection zone. One way of realizing such a deflection device is, for example, to deploy a variable-potential drift tube within the dispersion device, which can be used to vary the (total) energy of the electron flux leaving the dispersion device, concurrently causing a positional shift of the post-dispersion spectral sub-beams along the dispersion direction. The skilled artisan will understand that a certain amount of fine tuning/drift correction can also be effected by adjusting the excitation to the dispersion device—though such adjustment will tend to be slower than via use of a dedicated deflection device as discussed above.

In a further embodiment of the invention, a second deflection device can be used to cause deflection of the post-dispersion beam/EELS spectrum in a direction normal to the dispersion direction. Such a deflection can be used to displace an EELS spectrum/spectral region from one detection zone to another, e.g. from a given detection zone, which has just finished registration and is now undergoing readout, and onto a next detection zone, which is to commence registration. Performing such deflection in a direction normal to the dispersion direction avoids dragging a bright ZLP along (the spectral axis of) a given detection zone, with the risk of causing "ghost peaks" in that zone. The second deflection device is preferably relatively fast, so as to reduce unnecessary overhead and increase throughput; in this respect, an electrostatic deflection mechanism is generally preferable to a magnetic one, since the former tends to be faster than the latter. The second deflection device also preferably adds few/minimal aberrations to the beam; accordingly, it is advantageously disposed after the final lens/multipole of the spectroscopic apparatus, so as to avoid causing off-axial aberrations in lenses that might otherwise be located downstream of it.

If desired, a second deflection device as described here can have a composite/two-stage structure that comprises an additional (electrostatic) "blanking deflector", which rapidly deflects the beam well out of the way—and then back again—during adjustment of the excitation of the deflection device in the previous paragraph. Such a blanking deflector can, for example, be located just upstream or downstream of the dispersion device. With regard to the situation (a)/ "Multiple EELS" possibility referred to above, and specifically the spectral pollution/crosstalk issue identified earlier, it can be advantageous to adhere to the following regimen:

If blanking deflection occurs to the "right" (e.g. the +Y direction in FIG. 4), then zone(s) used to register a relatively bright spectral portion (such as a ZLP) should be located to the right of zone(s) used to register a relatively dim spectral portion (such as CLPs/IFs). This helps prevent artifact peaks in the latter zones.

Conversely, if blanking deflection occurs to the "left" (e.g. the −Y direction in FIG. 4), then zone(s) used to register a relatively bright spectral portion (such as a ZLP) should be located to the left of zone(s) used to register a relatively dim spectral portion (such as CLPs/IFs).

In an alternative embodiment that does not use such a dedicated blanking deflector, the beam can be "parked" between two detection zones during said adjustment.

In another embodiment of the invention, at least one of the detection zones is further divided into two parts, which are configured to be read out concurrently. Preferably, several—or all—of the detection zones will be divided/read out in this way. Such a configuration effectively halves the readout time per detection zone, thus allowing a further substantial increase in attainable throughput. Furthermore, dividing a detection zone in this matter (with a divisor extending parallel to the dispersion direction) allows a difference signal between said two parts to be used as a metric to determine an alignment error of an EELS spectrum overlaid on said parts; in such a scenario, said difference signal can be used as a zero signal, whereby alignment is ideally adjusted so as to reduce the difference signal to zero.

Although the discussion above has consistently mentioned three different detection zones, the number three should be seen as a minimum number in this context. Since the readout time per detection zone is effectively constant (e.g. ca. 100 µs), having a greater number of detection zones essentially allows more "up time" registration activity to occur (in other zones) during the "down time" of a given zone. Moreover, the greater the number of zones, the longer will be the relative "rest" time between consecutive invocations of a given detection zone (to register electrons), thus enhancing the advantages referred to above (such as allowing more complete charge drain). On the other hand, increasing the number of zones can create challenges as regards the deflection devices referred to above, since a larger-amplitude deflection brings the attendant risk of increased aberrations. The inventors have conducted tests with zone cardinalities in the range three to nine, and have found a detector with a total of five detection zones to represent a good compromise between the two competing effects alluded to above. With five rectangular detection zones, each comprising 2048 pixels measuring ca. 800 µm×14 µm, the inventors could satisfactorily acquire ca. 10,000 EELS spectra per second—which is ten times more than what is currently achievable in conventional Dual-EELS approaches.

For five detection zones, a total of five detection zones are used to consecutively register a plurality of EELS spectral entities, and during registering of one of said plurality of EELS spectral entities with one of the five detection zones, at least two other detection zones (such as for example, two, three or four) are being read (either concurrently or consecutively).

As already alluded to above, one can dispose a scintillation layer at a side of the detector facing the specimen. Such a scintillation layer does not have to physically contact the detector, e.g. it may be separated therefrom by bundle of waveguides. Use of intervening waveguides in this manner can, for example, help to avoid X-rays (generated by impact of the primary beam) from reaching the detector. It can also help to cap the number of photons reaching the detector, thus preventing excessive secondary charge generation in the detector.

The actual detector employed in the invention may, for example, comprise one or more of:
A pixelated CCD detector;
A pixelated array of avalanche photodiodes;
A pixelated CMOS detector,
and combinations hereof. In the case of presently-available CCD sensors, since it is not possible to read out different parts hereof at different times, each detection zone should comprise a separate CCD array. Avalanche photodiode arrays are sometimes referred to as Solid State Photo-Multipliers (SSPMs).

EMBODIMENT 1

Figure 1:
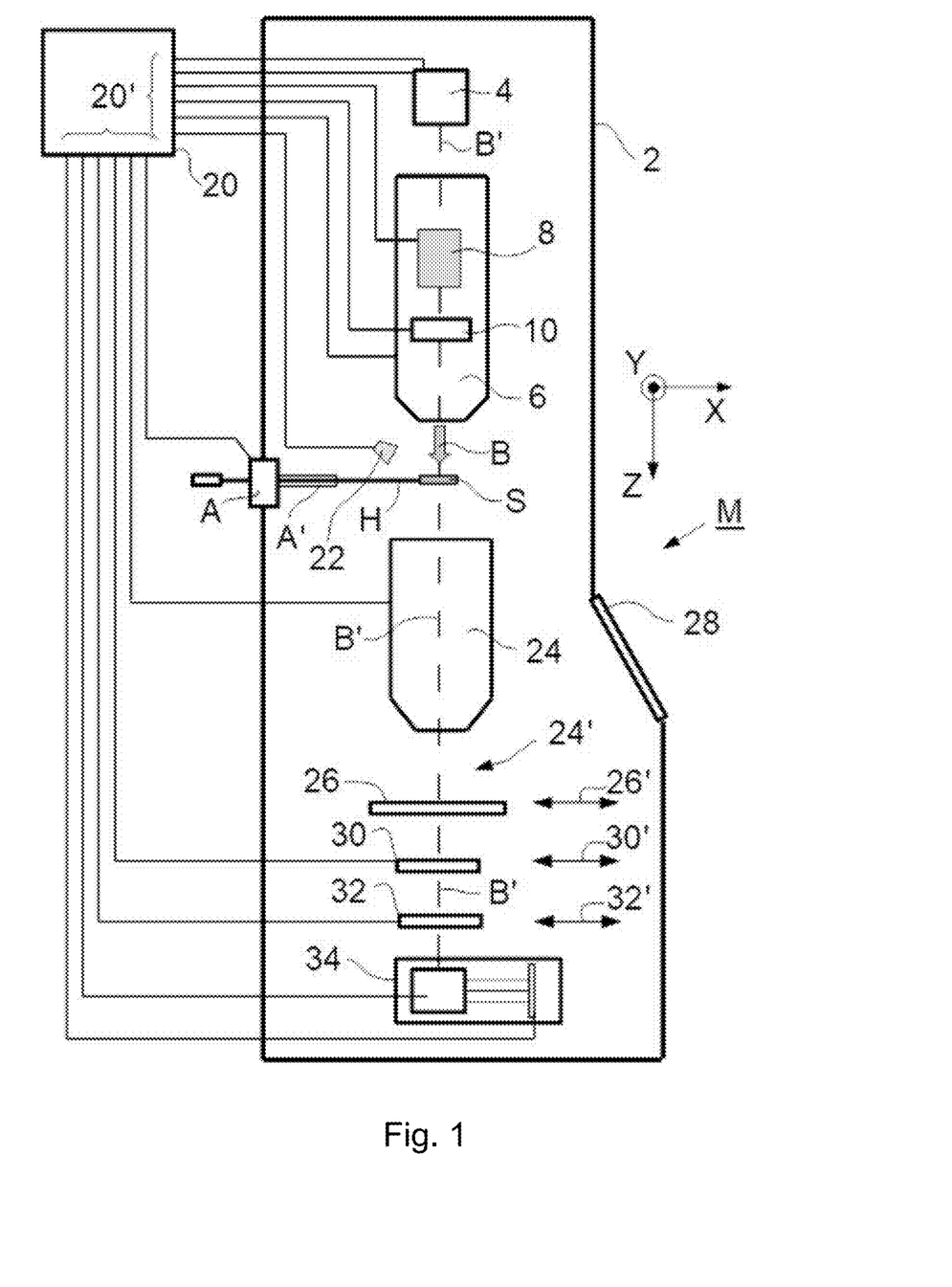
FIG. 1 renders a longitudinal cross-sectional elevation view of an embodiment of an electron microscope in which the present invention is implemented.

FIG. 1 (not to scale) is a highly schematic depiction of an embodiment of a (S)TEM M in which the present invention is implemented (though, in the context of the present invention, M could alternatively be a TSEM). In the Figure, within a vacuum enclosure 2, an electron source 4—such as a Schottky FEG, for example—produces a beam B of electrons that propagates along an electron-optical axis B' and traverses an electron-optical illuminator 6, serving to direct/focus the electrons onto a chosen part of a specimen S (which may, for example, be (locally) thinned/planarized).

Also depicted is a deflector 10, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction), and/or allows scanning motion to be performed as an alternative to beam scanning. If desired, an optional cooling device (not depicted) can be brought into intimate contact with the specimen holder H, so as to maintain it (and the specimen S thereupon) at cryogenic temperatures, for example.

Optionally present in the illuminator 6 is a monochromator 8. The source 4 radiates rays (electron paths) in a variety of directions, and these rays pass into a disperser/particle prism (not depicted) in the monochromator 8, where dispersion occurs, i.e. a differential deflection that depends on the exact energy of the particle passing along a given nominal path/ray, which causes a spectral spread in the various rays. A monochromator slit (not depicted) is used to select a relatively narrow sub-section of this spectral spread, thus passing only a selected energy range. This monochromator slit may, for example, be set at ground potential, which facilitates the construction of the slit; alternatively, the monochromator slit can, for example, be positioned in or proximal to the dispersive element of the monochromator.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen (sensing device) 26, which, if desired, can be retracted/withdrawn (as schematically indicated by arrows 26') so as to get it out of the way of axis B'. An image or diffractogram of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image/diffractogram on screen 26, one can instead make use of the fact that the depth of focus of the electron flux leaving imaging system 24 is generally quite large (e.g. of the order of 1 meter). Consequently, various other types of sensing device can be used downstream of screen 26, such as:

- TEM camera 30. At camera 30, electron flux B'' can form a static image or diffractogram that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.
- STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g., 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).
- As an alternative to imaging using cameras 30 or 32, one can also invoke spectroscopic apparatus 34, which, in the current example, is an EELS module.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

Figure 2:
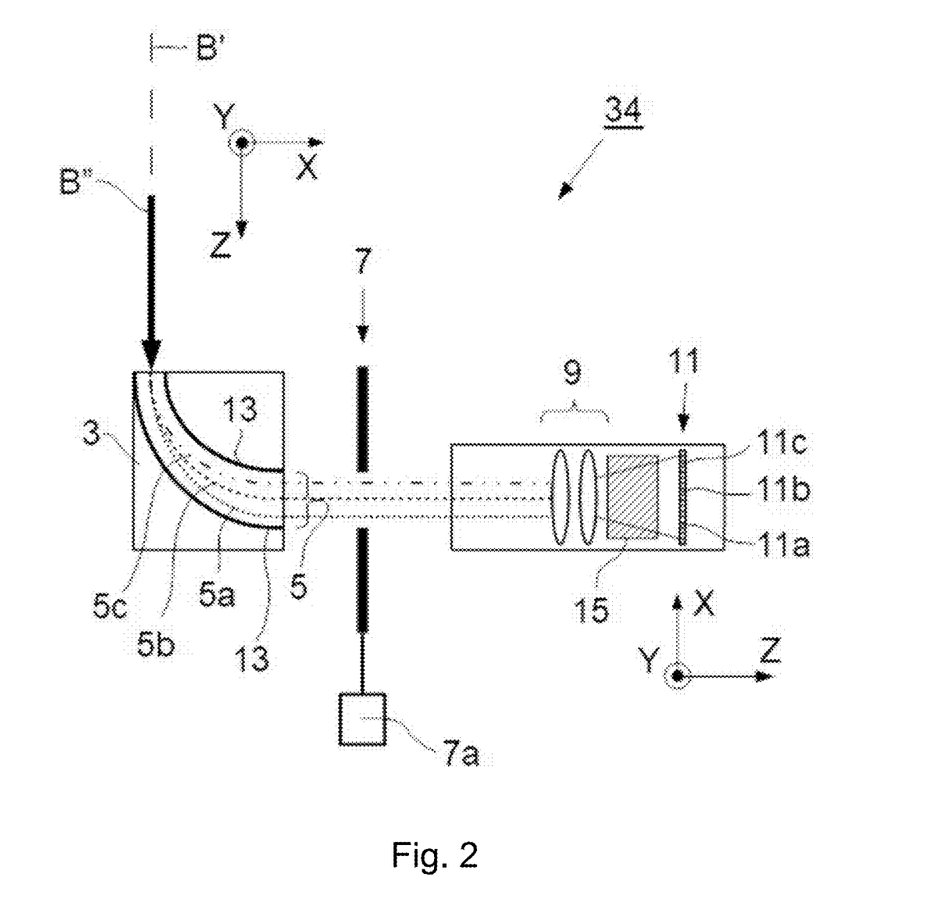
FIG. 2 shows an enlarged and more detailed view of part of FIG. 1.

Turning now to FIG. 2, this shows an enlarged and more detailed view of the spectroscopic apparatus (EELS module) 34 in FIG. 1. In the Figure, flux B'' of electrons (which has passed through specimen S and imaging system 24) is shown propagating along electron-optical axis B'. The flux B'' enters a dispersion device 3 ("electron prism"), where it is dispersed (fanned out) into an energy-resolved/energy-differentiated (continuous) array 5 of spectral sub-beams (schematically indicated in FIG. 2 using broken lines), which are distributed along dispersion direction X; for illustration purposes, three of these sub-beams are labelled 5a, 5b and 5c in the Figure. Note in this regard that, conventionally, propagation is considered to occur along the Z direction, and the depicted Cartesian coordinate system thus "co-deflects with" the flux B" within the dispersion device 3. As an alternative to the "elbow-shaped" configuration in FIG. 2, one could also use a so-called "omega filter"/"in-line filter", which produces output sub-beams that are essentially parallel to the input flux B".

Downstream of item 3, the array/spectrum 5 of sub-beams encounters an adjustable/retractable slit (letterbox) 7, which can, for example, be used in EFTEM-mode to select/admit a given region of the array 5 and to discard/occlude other regions thereof; to this end, the slit 7 is connected to an actuation device 7a that can be invoked to open/close/move the (opening in the) slit 7 as desired. In EELS mode, this slit 7 is usually (fully) open/ retracted. After having traversed slit 7, the (selected region of the) array 5 passes through post-dispersion electron optics 9, where it is magnified/focused, for example, and ultimately directed/projected onto detector 11 (comprising, for example, a CMOS or CCD circuit architecture), with sub-beams 5a, 5b and 5c respectively impinging upon detector parts 11a, 11b and 11c. The skilled artisan will understand that the slit 7 is advantageously disposed at a location at or proximal to a dispersion plane of the spectroscopic apparatus 34; similarly, the detector 11 is also advantageously located at or proximal to such a plane.

Illustrated in FIG. 2 are two deflection devices 13, 15, with the aid of which it is possible to move array/spectrum 5 relative to the slit 7/detector 11. For example:

In the X (dispersion) direction: One can adjust a driving signal/electrical potential to first deflection device 13, which can be embodied as a drift tube with an adjustable offset voltage, for example. A similar effect could be obtained by adjusting a current (in the case of a magnetic prism) or potential (in the case of an electrostatic 90-degree deflector) applied to the dispersion device 3.

In the Y (non-dispersion) direction: One can adjust a driving signal/electrical potential to second deflection device 15, which may be embodied as an electrostatic deflector, for example.

These deflection devices 13, 15 will be discussed in greater detail below. As already detailed above, deflection device 15 may, if desired, have a two-stage structure, with a dedicated "blanking stage". This is not illustrated here.

Figure 3:
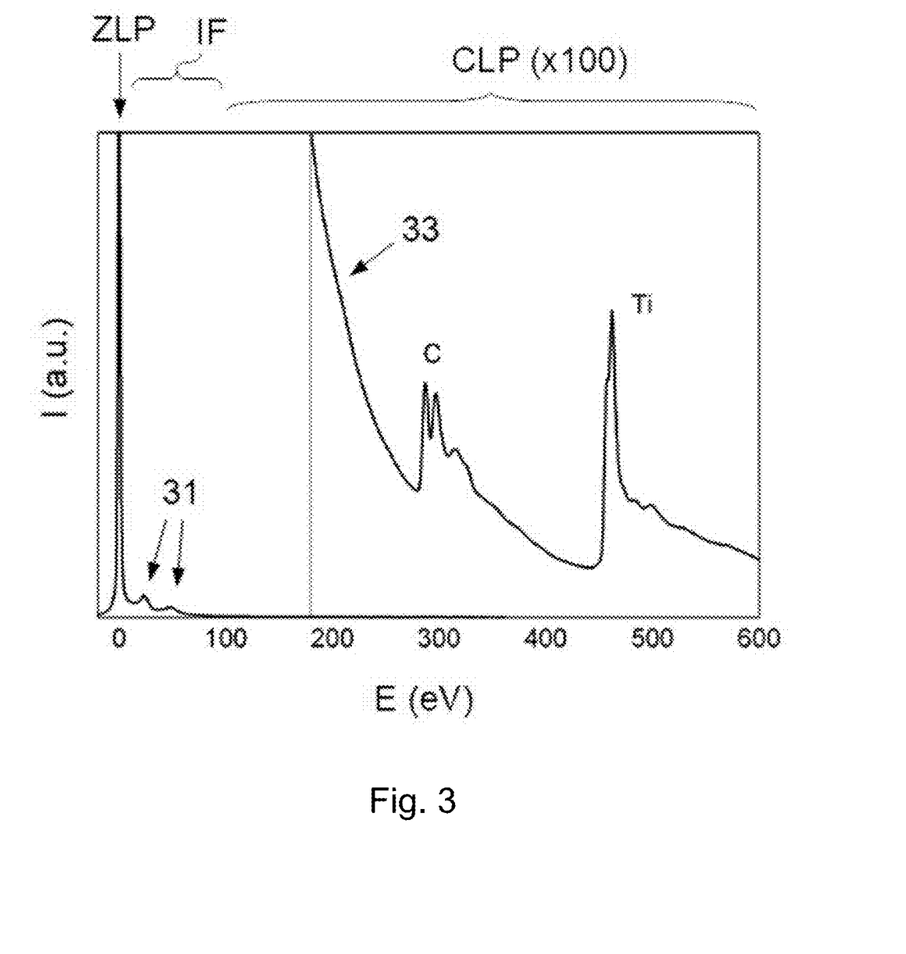
FIG. 3 shows an example of an EELS spectrum.

FIG. 3 shows an example of an EELS spectrum. The Figure renders intensity I (in arbitrary units, a.u.) as a function of energy-loss E (in eV) for electrons that have traversed a specimen containing Carbon and Titanium. From left to right, the main features of the spectrum are:

A Zero-Loss Peak [ZLP], representing electrons that traverse the specimen without undergoing inelastic scattering therein.

An Intermediate Feature [IF] region, e.g., comprising one or more Plasmon Resonance Peaks (PRPs; sometimes referred to as a Valence Loss components), phonon peaks, band gap features, etc. This region typically extends from about 0 to 50 eV, although there is no strict definition of its upper limit. It is characterized by peaks/shoulders resulting from outer-shell scattering events in the specimen, such as peaks 31. Note that IF features usually have a significantly lower intensity than the ZLP.

A Core Loss Peak [CLP] region. This typically starts at about 50 eV (after the IF region), although there is no strict definition of its lower limit. It is typically of such a low intensity relative to the ZLP/IF regions that, as rendered in FIG. 3, it is enlarged by a multiplication factor (e.g. 100) to improve visibility of its details. As can be seen, it contains (clusters of) peaks/shoulders that can be associated with certain chemical elements (such as C and Ti, in the current example), seated on top of a substantial background contribution 33.

Figure 4:
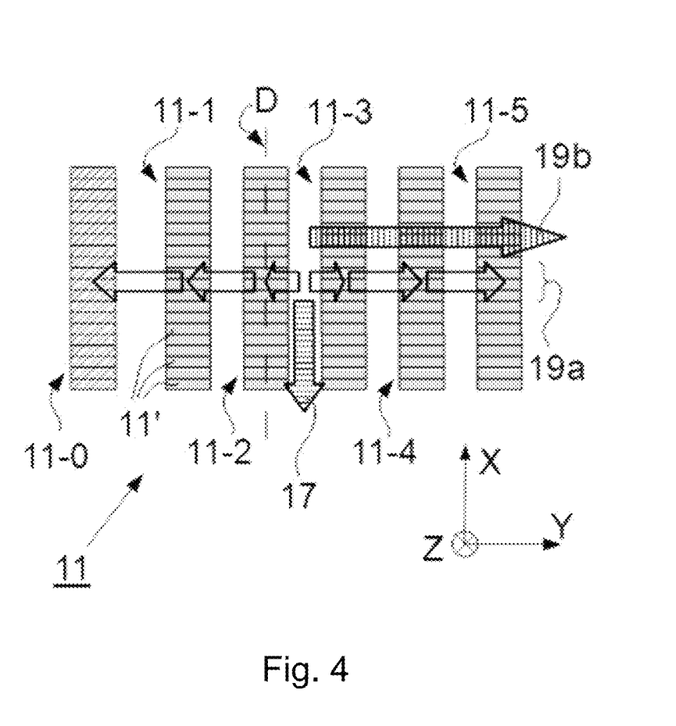
FIG. 4 shows an enlarged and more detailed view of part of FIG. 2, more specifically a detector configuration according to the invention.

Turning now to FIG. 4, this illustrates how, in accordance with the present invention, detector 11 is sub-divided into a plurality of detection zones (pixelated CCD strips in the current configuration). In this particular case, there are five such zones 11-1, 11-2, 11-3, 11-4, 11-5, and there is also a general "calibration/alignment" zone 11-0. Generically, the various zones can be labelled "11-n", where $n \in \{0, 1, 2, \ldots\}$. The dispersion direction is parallel to X. As here depicted, the various zones 11-n are disposed in a linear arrangement along the Y axis, though this does not necessarily have to be the case. Also, as here embodied, the zones 11-n are all of the same size and shape, but this also does not necessarily have to be so. Furthermore, in the present configuration, the zones 11-1-11-5 are essentially equally spaced, though this is not mandatory. The combined detection areas of the various zones 11-n can be regarded as comprising the detection surface of the detector 11. In the current illustration, the following non-binding exemplary dimensions can be envisioned:

Height of each zone 11-n parallel to X: 29 mm.
Width of each zone 11-n parallel to Y: 0.8 mm.
Mutual separation of consecutive zones 11-1 . . . 11-5 parallel to Y: 2.4 mm.
Separation of zone 11-0 and 11-1: ca. 3 mm.

If desired, one or more of the strips 11-1 . . . 11-5 can be administratively divided into two parts, which are configured to be read out concurrently; in this regard, note the illustrated bisector D of strip 11-2. In the current set-up, each pixel 11' measures ca. 800 μm×14 μm (along Y and X, respectively).

In the invention, the presence of a multiplicity of strips 11-1 . . . 11-5 allows a multiplexing detection strategy, whereby:

A first zone 11-i is used to register one of a plurality of EELS spectral entities;

A second zone 11-j is used to register one of a plurality of EELS spectral entities;

A third zone 11-k is used to register one of a plurality of EELS spectral entities;

First zone 11-i and second zone 11-j are read out whilst third zone 11-k is still registering (or vice versa).

For example, if the beam B is scanned over the surface of specimen S, whereby the resulting scan path traverses a plurality of successive sampling positions on the specimen, then said plurality of spectral entities may comprise first and second spectral entities; each of which may comprise essentially complete EELS spectra—or, alternatively, corresponding regions from two EELS spectra—respectively taken at two different (e.g. successive) sampling positions on the specimen. Other possibilities are discussed in the text above. In a specific use case of the five zones 11-n as here illustrated, the dispersed beam successively moves onto (and dwells upon) zones 11-2, 11-3, 11-4 and 11-5 while originally-exposed zone 11-1 undergoes its read-out cycle; more generally, zones 11-(i+1), 11-(i+2), . . . , 11-(i−2), 11-(i−1) undergo successive registration cycles while zone 11-i undergoes its read-out cycle. The same basic principle can be applied to zone numbers other than five. However, other exposure sequencing is also possible: see Embodiment 2, for example.

As regards the effects of the first and second deflection devices 13, 15 referred to above, these can be better understood by referring to the various horizontal and vertical arrows in the Figure. More specifically:

First deflection device 13 can be used to produce (fine-tuning) deflection parallel to X, as illustrated by arrow 17.

Second deflection device 15 can be used to produce "hopping" deflection parallel to Y, allowing a spectrum to be disposed at will on one of the zones 11-n, as illustrated by arrows 19a.

If desired, (part of) second deflection device 15 can also be used to produce "blanking deflection" of the dispersed beam to an area outside the perimeter of the strips 11-n, as illustrated by arrow 19b.

As here illustrated, the dispersing device 3 is adjusted so that the nominal/zero-deflection position of the dispersed beam is between two zones 11-n, in this case zones 11-2 and 11-3. In this particular set-up:

Maximal deflection of arrow 17 corresponds to a potential of ca. 2.5 kV on deflector 13.

Maximal deflection of arrows 19a corresponds to a potential of ca. 2.5 kV on deflector 15.

EMBODIMENT 2

As an alternative to the exposure sequencing described in the previous paragraph, one could, for example, expose zones 11-n in the order:

..., 11-1, 11-2, 11-1, 11-3, 11-1, 11-4, 11-1, 11-5, 11-1, 11-2, 11-1, 11-3, ...

whereby one keeps returning to zone 11-1 (underlined above for pattern emphasis) between visits to successive other zones 11-2, ..., 11-5. Such sequencing can be useful if, for example:

Zone 11-1 is consistently used to register a ZLP, and the other zones are used to register other spectral features, such as CLPs;

One wishes to track instabilities in the microscope's high-voltage power supply, via fluctuations in the CLP intensity.

As mentioned above, such a procedure is referred to as "tracking the ZLP", and it can be executed with particular efficiency using the present invention.

The invention claimed is:

1. A method of performing Electron Energy-Loss Spectroscopy (EELS) in an electron microscope, comprising:
   providing a specimen on a specimen holder;
   providing a spectroscopic apparatus comprising a dispersion device and a detector, wherein the detector comprises a detection surface that is sub-divided into a plurality of detection zones;
   producing a beam of electrons from a source;
   using an illuminator to direct said beam so as to irradiate the specimen;
   using an imaging system to receive a flux of electrons transmitted through the specimen and direct it onto the spectroscopic apparatus;
   dispersing, with the dispersion device, said flux in a dispersion direction so as to form an EELS spectrum; and
   using at least a first detection zone, a second detection zone and a third detection zone of the plurality of detection zones to consecutively register a plurality of EELS spectral entities, wherein said first and said second detection zones are read out whilst said third detection zone is registering the one of said plurality of EELS spectral entities.

2. A method according to claim 1, wherein said plurality of EELS spectral entities comprise a first and second spectral entities, comprising different regions of a single EELS spectrum, taken at a single position on the specimen.

3. A method according to claim 2, wherein, repeatedly in a set of measurements at different specimen positions, the first detection zone is used to register a relatively bright spectral portion only and the second detection zone and third detection zone are used to register a relatively dim spectral portion only.

4. A method according to claim 1, wherein said plurality of EELS spectral entities comprise first and second spectral entities, comprising corresponding regions from two EELS spectra, respectively taken at two different positions on the specimen.

5. A method according to claim 1, wherein said plurality of EELS spectral entities comprise first and second spectral entities, comprising a same region of an EELS spectrum, taken at the same position on the specimen.

6. A method according to claim 5, wherein a first detection result from the first zone and second detection result from the second zone are mutually subtracted so as to yield a differential spectrum.

7. A method according to claim 1, wherein a first deflection device is used to fine-tune a position of said EELS spectrum parallel to the dispersion direction.

8. A method according to claim 1, wherein a second deflection device is used to deflect the EELS spectrum in a direction substantially normal to said dispersion direction.

9. A method according to claim 8, wherein, between registration sessions on two neighboring detection zones, at least part of said second deflection device is used to perform at least one of the following actions:
   deflect the EELS spectrum to a location outside a perimeter of the detection surface; and
   park the EELS spectrum at a location between said neighboring zones.

10. A method according to claim 9, wherein, if deflection to a location outside said perimeter occurs in a direction extending from the first detection zone toward the second detection zone, then the first detection zone is used to register a relatively dim spectral portion and the second detection zone is used to register a relatively bright spectral portion.

11. A method according to claim 1, wherein at least one of the detection zones is further divided into two parts, which are configured to be read out concurrently.

12. A method according to claim 11, wherein a difference signal between said two parts is used as a metric to determine an alignment error of an EELS spectrum between said parts.

13. A method according to claim 1, wherein said detection surface comprises more than three of said detection zones.

14. A method according to claim 13, wherein said detection surface comprises a total of five of said detection zones.

15. An electron microscope, comprising:
   a source, for producing a beam of electrons;
   an illuminator, for directing said beam so as to irradiate the specimen;
   an imaging system, for receiving a flux of electrons transmitted through the specimen and directing it onto an Electron Energy-Loss Spectroscopy (EELS) apparatus comprising:
   dispersion device, for dispersing said flux in a dispersion direction so as to form an EELS spectrum; and
   a detector, comprising a detection surface that is sub-divided into a plurality of detection zones; and a controller, for controlling at least some operational aspects of the microscope, wherein said controller is configured to:

use at least a first detection zone, a second detection zone and a third detection zone to consecutively register a plurality of EELS spectral entities; and read out said first and said second detection zones whilst said third detection zone is registering one of said plurality of EELS spectral entities.

* * * * *